United States Patent
Kim et al.

(10) Patent No.: US 9,666,817 B2
(45) Date of Patent: May 30, 2017

(54) ORGANIC PHOTODETECTOR AND IMAGE SENSOR

(71) Applicant: Samsung Electronics Co., Ltd., Suwon-si, Gyeonggi-do (KR)

(72) Inventors: Kyusik Kim, Yongsin-si (KR); Jang-Joo Kim, Seoul (KR); Dae-Ho Kim, Seoul (KR)

(73) Assignees: Samsung Electronics Co., Ltd., Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 14/995,318

(22) Filed: Jan. 14, 2016

(65) Prior Publication Data
US 2017/0033303 A1    Feb. 2, 2017

(30) Foreign Application Priority Data
Jul. 31, 2015    (KR) .................. 10-2015-0108694

(51) Int. Cl.
| | | |
|---|---|---|
| H01L 27/146 | (2006.01) | |
| H01L 51/42 | (2006.01) | |
| H01L 51/44 | (2006.01) | |
| H01L 27/30 | (2006.01) | |
| H01L 51/00 | (2006.01) | |

(52) U.S. Cl.
CPC .......... *H01L 51/424* (2013.01); *H01L 27/307* (2013.01); *H01L 51/442* (2013.01); *H01L 51/0046* (2013.01)

(58) Field of Classification Search
CPC ............. H01L 25/167; H01L 27/14643; H01L 27/307; H01L 27/3227; H01L 31/02024
See application file for complete search history.

(56) References Cited

U.S. PATENT DOCUMENTS

| | | | |
|---|---|---|---|
| 6,972,431 B2 | 12/2005 | Forrest et al. | |
| 2010/0207112 A1 | 8/2010 | Furst et al. | |
| 2013/0247992 A1* | 9/2013 | Drees | ........... H01L 51/0043 136/263 |

(Continued)

FOREIGN PATENT DOCUMENTS

KR    20140044848 A    4/2014

OTHER PUBLICATIONS

Sebastian Valouch et al. "Solution processed small molecule organic interfacial layers for low dark current polymer photodiodes", Organic Electronics. 2012. pp. 2727-2732. Elsevier B.V.

(Continued)

*Primary Examiner* — Hoai V Pham
(74) *Attorney, Agent, or Firm* — Harness, Dickey & Pierce, P.L.C.

(57) ABSTRACT

An organic photodetector includes an anode and a cathode facing each other and an active layer between the anode and the cathode and including a p-type semiconductor and an n-type semiconductor, wherein an energy barrier between the anode or the cathode and the active layer is greater than or equal to about 1.3 eV, a difference between a HOMO energy level of the p-type semiconductor and a LUMO energy level of the n-type semiconductor is greater than or equal to about 0.8 eV.

16 Claims, 7 Drawing Sheets

(56) References Cited

U.S. PATENT DOCUMENTS

2014/0110696 A1 4/2014 Benwadih
2015/0060775 A1 3/2015 Liang et al.

OTHER PUBLICATIONS

Panagiotis E. Keivanidis et al. "All-solution based device engineering of multilayer polymeric photodiodes: Minimizing dark current". Applied Physics Letters. Apr. 2009. pp. 1-3. American Institute of Physics.
Taichiro Morimune et al. "Photoresponse Properties of a High-Speed Organic Photodetector Based on a Copper-Phthalocyanine Under Red Light Illumination". IEEE Photonics Technology Letters, vol. 18, No. 24. Dec. 2006. pp. 2662-2664.
Maddalena Binda et al. "High detectivity squaraine-based near infrared photodetector with nA/cm(2) dark current". Applied Physics Letters. Feb. 2011. pp. 1-3. American Institute of Physics.

* cited by examiner

ORGANIC PHOTODETECTOR AND IMAGE SENSOR

CROSS REFERENCE TO RELATED APPLICATIONS

This application claims priority to and the benefit of Korean Patent Application No. 10-2015-0108694 filed in the Korean Intellectual Property Office on Jul. 31, 2015, the entire contents of which are incorporated herein by reference.

BACKGROUND

1. Field

Example embodiments provide an organic photodetector and/or an image sensor including the same.

2. Description of the Related Art

A photodetector typically converts light into an electrical signal, and may include a photodiode, a phototransistor, etc. The photodetector may be applied to an image sensor, a solar cell, etc.

An image sensor including a photodiode requires typically high resolution, and thus, a relatively small pixel. At present, a silicon photodiode is widely used, but exhibits deteriorated sensitivity because of a relatively small absorption area due to the relatively small pixels. Accordingly, an organic material that is capable of replacing silicon has been researched.

The organic material has a relatively high extinction coefficient and selectively absorbs light in a particular wavelength region depending on a molecular structure, and thus may simultaneously replace a photodiode and a color filter, thereby improving sensitivity and contributing to relatively high integration.

SUMMARY

Example embodiments provide an organic photodetector capable of improving the sensitivity by decreasing the dark current density.

Example embodiments also provide an image sensor including the organic photodetector.

According to example embodiments, an organic photodetector includes an anode and a cathode facing each other, and an active layer between the anode and the cathode, the active layer including a p-type semiconductor and an n-type semiconductor, wherein a difference between a highest occupied molecular orbital (HOMO) energy level of the p-type semiconductor and a lowest occupied molecular orbital (LUMO) energy level of the n-type semiconductor is greater than or equal to about 0.8 eV, and wherein an energy barrier between the active layer and one of the anode and the cathode is greater than or equal to about 1.3 eV.

The energy barrier between the active layer and one of the anode and the cathode may be one of an energy difference between a work function of the anode and a LUMO energy level of the p-type semiconductor and an energy difference between a work function of the cathode and a HOMO energy level of the n-type semiconductor.

The organic photodetector may have a dark current density of less than or equal to about $10^{-10}$ A/cm$^2$ at a reverse bias of about −3 V.

The energy barrier of the active layer and one of the anode and the cathode may be greater than or equal to about 1.5 eV, and the difference between the HOMO energy level of the p-type semiconductor and the LUMO energy level of the n-type semiconductor may be greater than or equal to about 1.0 eV.

The organic photodetector may have a dark current density of less than or equal to about $10^{-12}$ A/cm$^2$ at a reverse bias of about −3 V.

The active layer may include a p-type layer closest to the anode and including a p-type semiconductor, and an n-type layer closest to the cathode and including an n-type semiconductor.

The organic photodetector may not include a charge blocking layer between the anode and the active layer or between the cathode and the active layer.

At least one of the p-type semiconductor and the n-type semiconductor may selectively absorb a part of a visible ray wavelength region.

At least one of the p-type semiconductor and the n-type semiconductor may selectively absorb a green wavelength region.

The anode may be indium tin oxide (ITO), the LUMO energy level of the n-type semiconductor may be about −4.1 eV, and the p-type semiconductor may be a material having a LUMO energy level of about −2.6 to about −3.5 eV and a HOMO energy level of about −4.9 to about −5.8 eV.

An electron blocking layer may not be between the anode and the active layer.

The anode may be ITO, the n-type semiconductor may be C$_{60}$, and the p-type semiconductor may be a material having a HOMO energy level of about −5.3 to about −5.8 eV.

An electron blocking layer may not be between the anode and the active layer.

The anode and the cathode may be light-transmitting electrodes.

According to example embodiments, an image sensor includes the organic photodetector of example embodiments.

According to example embodiments, an electronic device includes the image sensor of example embodiments.

DETAILED DESCRIPTION

Figure 1:
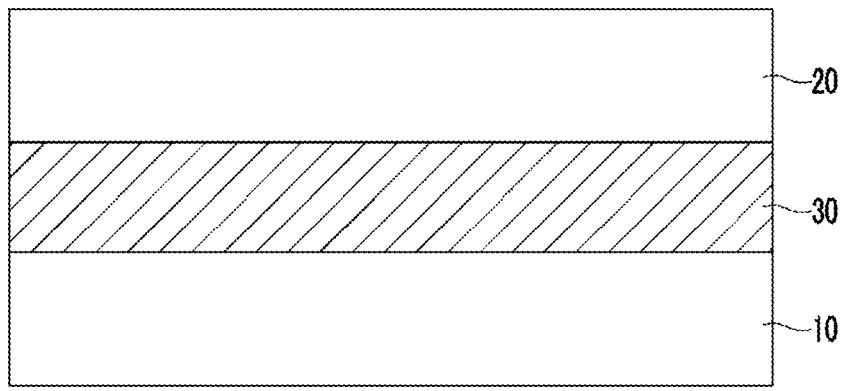
FIG. 1 is a cross-sectional view showing an organic photodetector according to example embodiments.

Example embodiments of the present inventive concepts will hereinafter be described in detail, and may be more easily performed by those who have common knowledge in the related art. However, this disclosure may be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numerals throughout the specification.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Hereinafter, referring to drawings, an organic photodetector according to example embodiments is described.

FIG. 1 is a cross-sectional view showing an organic photodetector according to example embodiments.

Referring to FIG. 1, an organic photodetector 100 according to example embodiments includes an anode 10 and a cathode 20 facing each other, and an active layer 30 between the anode 10 and the cathode 20.

At least one of the anode 10 and the cathode 20 may be a light-transmitting electrode, and the light-transmitting electrode may be made of, for example, a transparent conductor, e.g., indium tin oxide (ITO) or indium zinc oxide (IZO), or a metal thin layer of a thin monolayer or multilayer. When one of the anode 10 and the cathode 20 is a non-light-transmitting electrode, the one of the anode 10 and the cathode 20 may be made of, for example, an opaque conductor (e.g., aluminum (Al)).

For example, the anode 10 and the cathode 20 may both be light-transmitting electrodes.

The active layer 30 includes a p-type semiconductor and an n-type semiconductor to form a pn junction, and absorbs light externally to generate excitons and then separates the generated excitons into holes and electrons.

The active layer 30 may include a p-type active layer disposed near to the anode 10 and including a p-type semiconductor, and an n-type active layer disposed near to the cathode 20 and including an n-type semiconductor. However, the active layer is not limited thereto. For example, the active layer may be a bulk heterojunction in which the p-type semiconductor and the n-type semiconductor are mixed in a monolayer and may be variously applied to a p-type layer/I layer, an I layer/n-type layer, a p-type layer/I layer/n-type layer, or the like.

At least one of the p-type semiconductor and the n-type semiconductor may include an organic semiconductor, the p-type semiconductor may be selected from compounds facilitating the hole transportation into an anode 10, and the n-type semiconductor may be selected from compounds facilitating the electron transportation into a cathode 20.

Meanwhile, when applying the reverse bias, a charge may be reversely injected from the anode 10 and the cathode 20 into an active layer 30. In other words, when applying the reverse bias, electrons may be injected from the anode 10 to the active layer 30, and holes may be injected from the cathode 20 into the active layer 30.

In addition, when applying the reverse bias, the dark current may occur from electron-hole pairs at the pn junction of the active layer 30.

In example embodiments, the dark current density of the organic photodetector 100 may be increased, so that the efficiency and the sensitivity may be deteriorated.

According to example embodiments, by adjusting the charge injection energy barrier between the electrode and the active layer 30 and the energy level of the p-type semiconductor and the n-type semiconductor in the active layer 30, the charge may be prevented or inhibited from being reversely injected from the electrode to the active layer 30 when applying the reverse bias.

Figure 2:
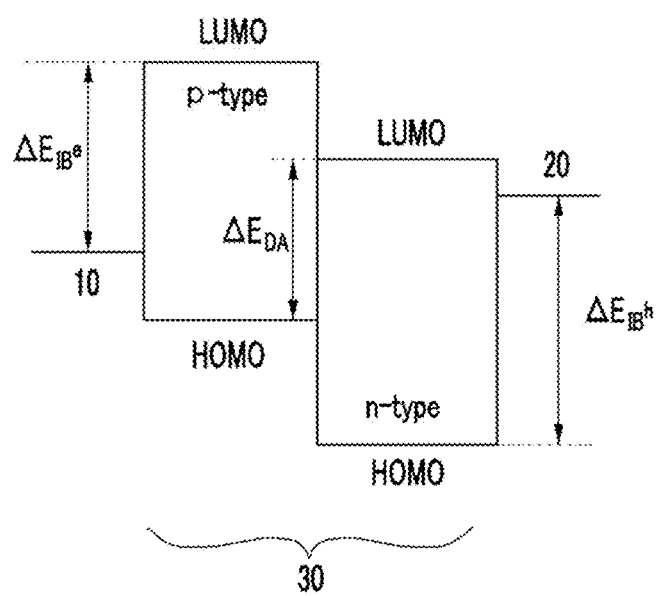
FIG. 2 is a diagram showing an energy level relationship between an electrode and an active layer at an organic photodetector according to example embodiments.

FIG. 2 is a diagram showing an energy level relationship of an electrode and an active layer in an organic photodetector according to example embodiments.

As shown in FIG. 2, the organic photodetector according to example embodiments includes an anode 10, an active layer 30 including a p-type semiconductor and an n-type semiconductor, and a cathode 20 which are sequentially stacked, wherein an energy barrier ($\Delta E_{IB}^e$) between the anode 10 and the active layer 30 and/or an energy barrier ($\Delta E_{IB}^h$) between the cathode 20 and the active layer 30, and the difference ($\Delta E_{DA}$) of between a highest occupied molecular orbital (HOMO) energy level of p-type semiconductor and a lowest occupied molecular orbital (LUMO) energy level of n-type semiconductor in the active layer 30, are important factors for preventing or inhibiting the charge from being reversely injected when applying the reverse bias.

The energy barrier ($\Delta E_{IB}^e$) between the anode 10 and the active layer 30 may be the energy difference between the work function of the anode 10 and the LUMO energy level of the p-type semiconductor in the active layer 30, and the energy barrier ($\Delta E_{IB}^h$) between the cathode 20 and the active layer 30 may be the energy difference between the work function of the cathode 20 and the HOMO energy level of the n-type semiconductor in the active layer 30.

For example, the energy barrier ($\Delta E_{IB}^e$) between the anode 10 and the active layer 30 may be greater than or equal to about 1.3 eV, and the difference ($\Delta_{DA}$) of the HOMO energy level of the p-type semiconductor and the LUMO energy level of the n-type semiconductor in the active layer 30 may be greater than or equal to about 0.8 eV.

For example, the energy barrier ($\Delta E_{IB}^e$) of the anode 10 and the active layer 30 may be about 1.3 eV to about 3.0 eV, and the difference ($\Delta E_{DA}$) between the HOMO energy level of the p-type semiconductor and the LUMO energy level of the n-type semiconductor in the active layer 30 may be about 0.8 eV to about 2.4 eV.

For example, the energy barrier ($\Delta E_{IB}^h$) of the cathode 20 and the active layer 30 may be greater than or equal to about 1.3 eV, and the difference ($\Delta E_{DA}$) between the HOMO energy level of the p-type semiconductor and the LUMO energy level of the n-type semiconductor in the active layer 30 may be greater than or equal to about 0.8 eV.

For example, the energy barrier ($\Delta E_{IB}^h$) of the cathode 20 and the active layer 30 may be about 1.3 eV to about 30 eV, and the difference ($\Delta E_{DA}$) between the HOMO energy level of the p-type semiconductor in the active layer 30 and the LUMO energy level of the n-type semiconductor may be about 0.8 eV to about 2.4 eV.

For example, the energy barrier ($\Delta E_{IB}^e$) of the anode 10 and the active layer 30 may be greater than or equal to about 1.3 eV, and the difference ($E_{DA}$) between the HOMO energy level of the p-type semiconductor and the LUMO energy level of the n-type semiconductor in the active layer 30 may be greater than or equal to about 0.8 eV.

By satisfying the energy level within the range, the charge injection from the electrode to the active layer 30 may be prevented or inhibited when applying the reverse bias. For example, the electron injection from the anode 10 to the active layer 30 may be prevented or inhibited, and the hole injection from the cathode 20 to the active layer 30 may be prevented or inhibited, when applying the reverse bias. Thereby, the dark current density may be lowered when applying the reverse bias.

For example, by satisfying the energy level within the range, the dark current density may be less than or equal to about $10^{-10}$ A/cm$^2$ when applying a reverse bias of about −3 V.

According to example embodiments, the energy barrier ($\Delta E_{IB}^e$) of the anode 10 and the active layer 30 may be greater than or equal to about 1.5 eV, and the difference ($\Delta E_{DA}$) of the HOMO energy level of the p-type semiconductor and the LUMO energy level of the n-type semiconductor in the active layer 30 may be greater than or equal to about 1.0 eV.

According to example embodiments, the energy barrier ($\Delta E_{IB}^e$) of the anode 10 and the active layer 30 may be about 1.5 eV to about 3.0 eV, and the difference ($\Delta E_{DA}$) of the HOMO energy level of the p-type semiconductor and the LUMO energy level of the n-type semiconductor in the active layer 30 may be about 1.0 eV to about 2.4 eV.

According to example embodiments, the energy barrier ($\Delta E_{IB}^h$) of the cathode 20 and the active layer 30 may be greater than or equal to about 1.5 eV, and the difference ($\Delta E_{DA}$) of the HOMO energy level of the p-type semiconductor in the active layer 30 and the LUMO energy level of the n-type semiconductor may be greater than or equal to about 1.0 eV.

According to example embodiments, the energy barrier ($\Delta E_{IB}^h$) of the cathode 20 and the active layer 30 may be about 1.5 eV to about 3.0 eV, and the difference ($\Delta E_{DA}$) of the HOMO energy level of the p-type semiconductor and the LUMO energy level of the n-type semiconductor in the active layer 30 may be about 1.0 eV to about 2.4 eV.

According to example embodiments, the energy barrier ($\Delta E_{IB}^e$) of the anode 10 and the active layer 30 may be greater than or equal to about 1.5 eV, the energy barrier ($\Delta E_{IB}^h$) of the cathode 20 and the active layer 30 may be greater than or equal to about 1.5 eV, and the difference ($\Delta E_{DA}$) between the HOMO energy level of the p-type semiconductor and the LUMO energy level of the n-type semiconductor at the active layer 30 may be greater than or equal to about 1.0 eV.

For example, by satisfying the energy level within the range, the dark current density may be less than or equal to about $10^{-12}$ A/cm$^2$ when applying reverse bias of about −3 V.

Figure 3:
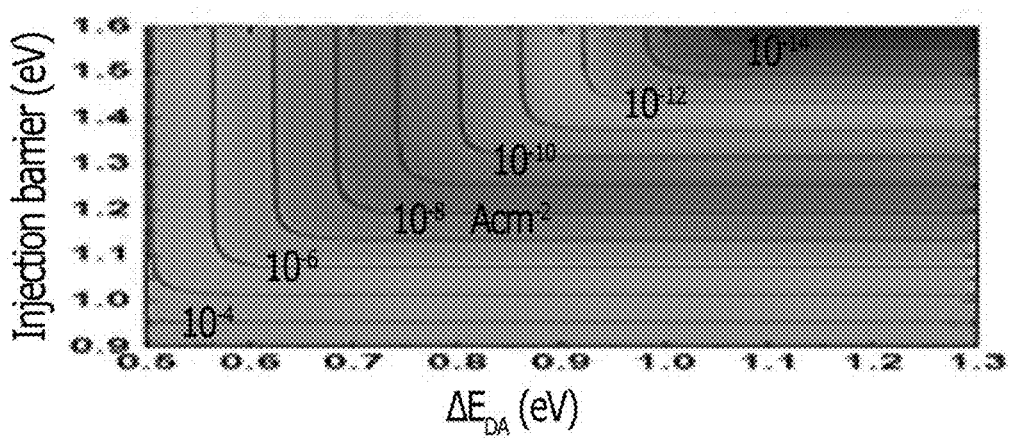
FIG. 3 is a graph showing a dark current density depending upon the difference of the energy barrier and the energy level when applying a reverse bias of −3 V to an organic photodetector according to example embodiments.

FIG. 3 is a graph showing a dark current density according to the energy level difference and the injection barrier when applying a reverse bias of −3 V to the organic photodetector according to example embodiments.

Referring to FIG. 3, assuming that the thickness of the active layer 30 is 50 nm, the influence of the dark current density by the energy barrier ($\Delta E_{IB}^{e}$, $\Delta E_{IB}^{h}$) between electrodes 10 and 20 and the active layer 30 and the energy level difference ($\Delta E_{DA}$) of the p-type semiconductor and the n-type semiconductor in the active layer 30 when applying the reverse bias of −3 V may be anticipated, and thereby, a p-type semiconductor and/or an n-type semiconductor may be selected by determining the desirable dark current density and considering the energy level.

At least one of the p-type semiconductor and the n-type semiconductor in the active layer 30 may be a material selectively absorbing a part of the visible ray wavelength region, for example, at least one of the p-type semiconductor and the n-type semiconductor may be a material selectively absorbing a green wavelength region.

The energy level is related to the absorption wavelength of the active layer 30.

Figure 4:
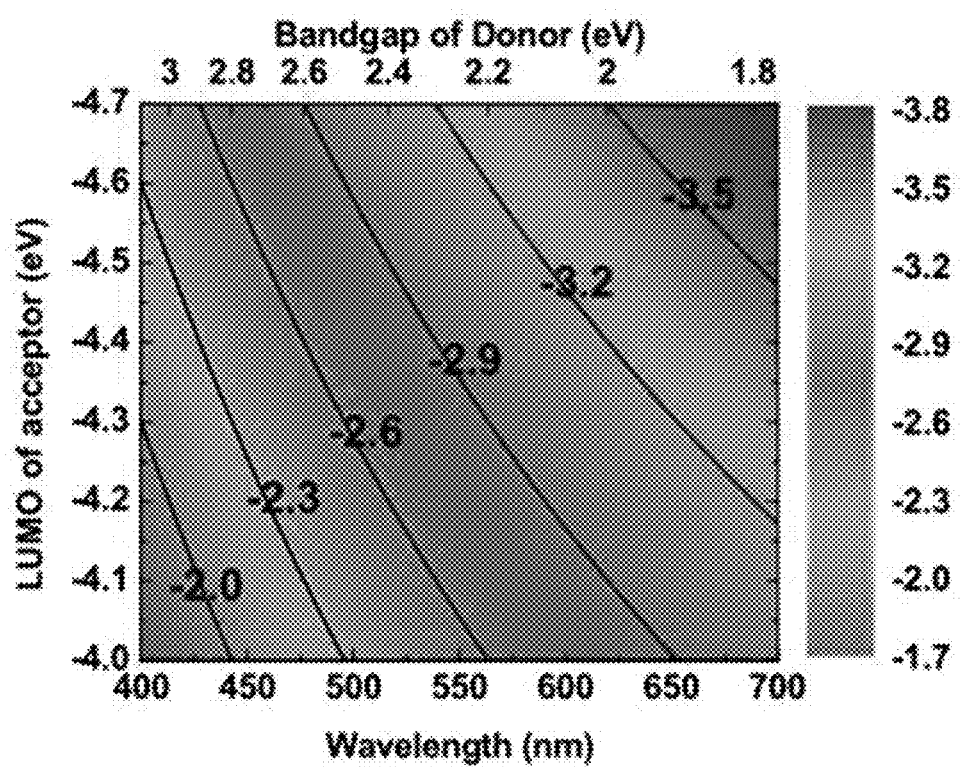
FIG. 4 is a graph showing a relationship between an absorption wavelength of an organic photodetector according to example embodiments and an energy level of a p-type semiconductor and an n-type semiconductor.

FIG. 4 is a graph showing a relationship between the absorption wavelength of the organic photodetector according to example embodiments and the energy level of the p-type semiconductor and the n-type semiconductor.

FIG. 4 shows the energy level of the p-type semiconductor and the n-type semiconductor which may have the dark current density of less than or equal to about $10^{-10}$ A/cm$^2$ when applying reverse bias of about −3 V. For example, when applying reverse bias of −3 V in a green wavelength region of about 535 nm, the LUMO energy level of the n-type semiconductor, the HOMO energy level of the p-type semiconductor, and LUMO energy level may be determined to provide a dark current density of less than or equal to about $10^{-10}$ A/cm$^2$.

For example, when the anode 10 is ITO (work function: about 4.8 eV), and when the LUMO energy level of n-type semiconductor is about −4.1 eV, the p-type semiconductor may be selected from materials satisfying each the LUMO energy level of about −2.6 to about −3.5 eV and the HOMO energy level of about −4.9 to about −5.8 eV.

For example, when the anode 10 is ITO, and when the n-type semiconductor is C$_{60}$ (LUMO energy level about −4.5 eV), the p-type semiconductor may be selected from materials satisfying the HOMO energy level of about −5.3 to about −5.8 eV.

In other words, one may easily select an n-type semiconductor or a p-type semiconductor to decrease the dark current density by fixing the anode 10 or the cathode 20 and the p-type semiconductor or the n-type semiconductor and considering the energy level.

Therefore, by controlling the charge injection energy barrier between the electrode and the active layer 30 and the energy level of the p-type semiconductor and the n-type semiconductor in the active layer 30, the charge reverse inflow from the electrode to the active layer 30 may be prevented or inhibited when applying the reverse bias. Accordingly, an additional charge blocking layer, e.g., an electron blocking layer, may not be required for preventing or inhibiting the electron reverse inflow from the anode 10 to the active layer 30 and/or a hole blocking layer may not be required for preventing or inhibiting the hole reverse inflow from the cathode 20 to the active layer 30.

In the organic photodetector 100, when light enters from the anode 10 and/or the cathode 20 and when the active layer 30 absorbs light having a given or predetermined wavelength region, excitons may be produced from inside the active layer 30. The excitons are separated into holes and electrons in the active layer 30, and the separated holes are transported to the anode 10 and the separated electrons are transported to the cathode 20 so as to flow a current in the organic photodetector.

Hereinafter, an organic photodetector according to example embodiments is described.

Figure 5:
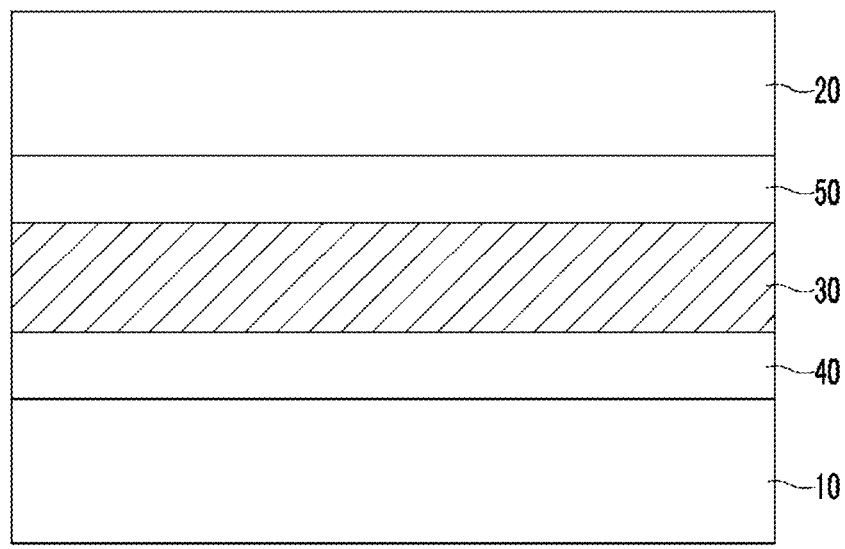
FIG. 5 is a cross-sectional view showing an organic photodetector according to example embodiments.

FIG. 5 is a cross-sectional view showing an organic photodetector according to example embodiments.

Referring to FIG. 5, an organic photodetector 200 according to example embodiments includes an anode 10 and a cathode 20 and an active layer 30 between the anode 10 and the cathode 20, like the example embodiment illustrated in FIG. 1.

However, the organic photodetector 200 according to example embodiments further includes charge auxiliary layers 40 and 50 between the anode 10 and the active layer 30, and the cathode 20 and the active layer 30, unlike the example embodiment illustrated in FIG. 1. The charge auxiliary layers 40 and 50 may facilitate the transfer of holes and electrons separated from the active layer 30, so as to increase efficiency.

The charge auxiliary layers 40 and 50 may be at least one selected from a hole injection layer (HIL) for facilitating hole injection, a hole transport layer (HTL) for facilitating hole transport, an electron injection layer (EIL) for facilitating electron injection, and an electron transport layer (ETL) for facilitating electron transport.

The charge auxiliary layers 40 and 50 may include, for example, an organic material, an inorganic material, or an organic/inorganic material. The organic material may be an organic compound having hole or electron characteristics, and the inorganic material may be, for example, a metal oxide, e.g., molybdenum oxide, tungsten oxide, nickel oxide, etc.

The hole transport layer (HTL) may include one selected from, for example, poly(3,4-ethylenedioxythiophene):poly (styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]piphenyl (α-NPD), m-MTDATA, 4,4',4"-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, Alq$_3$, Gaq$_3$, Inq$_3$, Znq$_2$, Zn(BTZ)$_2$, BeBq$_2$, and a combination thereof, but is not limited thereto.

One of the charge auxiliary layers 40 and 50 may be omitted.

The organic photodetector may be applied to various fields, for example, a solar cell, an image sensor, a photodetector, a photo-sensor, and an organic light emitting diode (OLED), but is not limited thereto.

Hereinafter, an example of an image sensor including the organic photodetector is described referring to drawings. As an example of an image sensor, an organic CMOS image sensor is described.

Figure 6:
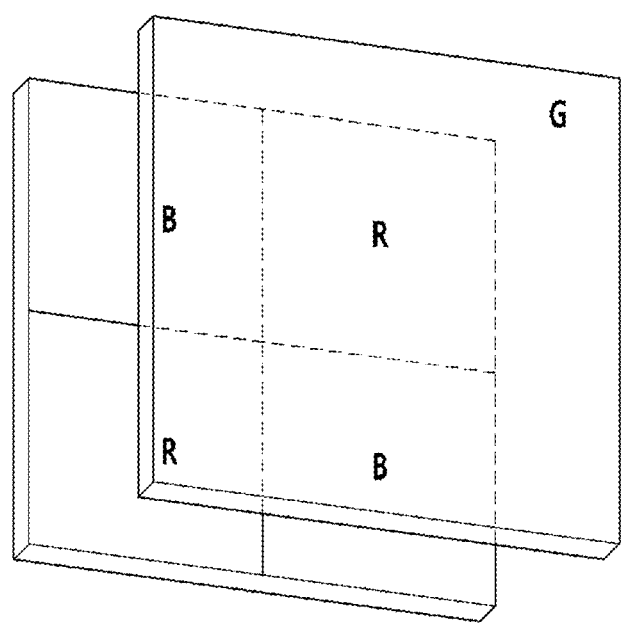
FIG. 6 is a top plan view of an organic CMOS image sensor according to example embodiments.
Figure 7:
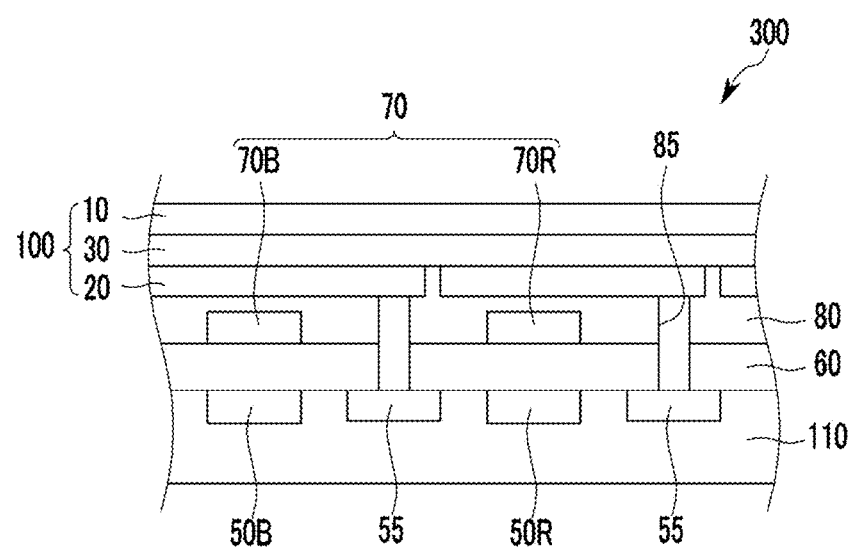
FIG. 7 is a cross-sectional view of the organic CMOS image sensor of FIG. 6.

FIG. 6 is a schematic top plan view of an organic CMOS image sensor according to example embodiments, and FIG. 7 is a cross-sectional view of the organic CMOS image sensor of FIG. 6.

Referring to FIGS. 6 and 7, an organic CMOS image sensor 300 according to example embodiments includes a semiconductor substrate 110 integrated with photo-sensing devices 50B and 50R, a transmission transistor (not shown), a charge storage device 55, a lower insulation layer 60, a color filter layer 70, an upper insulation layer 80, and an organic photodetector 100.

The semiconductor substrate 110 may be a silicon substrate, and is integrated with the photo-sensing device 50, the transmission transistor (not shown), and the charge storage device 55. The photo-sensing devices 50R and 50B may be photodiodes.

The photo-sensing devices 50B and 50R, the transmission transistor, and/or the charge storage device 55 may be integrated in each pixel, and as shown in the drawing, the photo-sensing devices 50B and 50R may be included in a blue pixel and a red pixel and the charge storage 55 may be included in a green pixel.

The photo-sensing devices 50B and 50R sense light, the information sensed by the photo-sensing devices may be transferred by the transmission transistor, the charge storage device 55 is electrically connected with the organic photodetector 100, and the information of the charge storage 55 may be transferred by the transmission transistor.

In the drawings, the photo-sensing devices 50B and 50R are, for example, arranged in parallel without limitation, and the blue photo-sensing device 50B and the red photo-sensing device 50R may be stacked in a vertical direction.

A metal wire (not shown) and a pad (not shown) are formed on the semiconductor substrate 110. In order to decrease signal delay, the metal wire and pad may be made of a metal having relatively low resistivity, for example, aluminum (Al), copper (Cu), silver (Ag), and alloys thereof, but are not limited thereto. Further, the metal wire and pad may be positioned under the photo-sensing devices 50B and 50R.

The lower insulation layer 60 is formed on the metal wire and the pad. The lower insulation layer 60 may be made of an inorganic insulating material, e.g., a silicon oxide and/or a silicon nitride, or a low dielectric constant (low K) material, e.g., SiC, SiCOH, SiCO, and SiOF. The lower insulation layer 60 has a trench exposing the charge storage device 55. The trench may be filled with fillers.

The color filter layer 70 is formed on the lower insulation layer 60. The color filter layer 70 includes a blue filter 70B formed in the blue pixel and a red filter 70R filled in the red pixel. In example embodiments, a green filter is not included, but a green filter may be further included.

The color filter layer 70 may be omitted. For example, when the blue photo-sensing device 50B and the red photo-sensing device 50R are stacked in a vertical direction, the blue photo-sensing device 50B and the red photo-sensing device 50R may selectively absorb light in each wavelength region depending on their stack depth, and the color filter layer 70 may not be equipped.

The upper insulation layer 80 is formed on the color filter layer 70. The upper insulation layer 80 eliminates a step caused by the color filter layer 70 and smoothes the surface. The upper insulation layer 80 and the lower insulation layer 60 may include a contact hole (not shown) exposing a pad, and a through-hole 85 exposing the charge storage 55 of the green pixel.

The organic photodetector 100 is formed on the upper insulation layer 80. The organic photodetector 100 includes the anode 10, the active layer 30, and the cathode 20 as described above.

The anode 10 and the cathode 20 may be transparent electrodes, and the active layer 30 is the same as described above. The active layer 30 selectively absorbs light in a green wavelength region and replaces a color filter of a green pixel.

When light enters from the anode 10, the light in a green wavelength region may be mainly absorbed in the active layer 30 and photoelectrically converted, while the light in the rest of the wavelength regions passes through cathode 20 and may be sensed in the photo-sensing devices 50B and 50R. However, it is not limited thereto, and when light enters from the cathode 20, the light having a green wavelength region may be mainly absorbed in the active layer 30 and converted to charge, while the light in the rest of the wavelength regions passes through the anode 10 and may be sensed by the photo-sensing devices 50B and 50R.

As described above, the organic photodetectors selectively absorbing light in a green wavelength region are stacked and thereby a size of an image sensor may be decreased and a down-sized image sensor may be realized.

In addition, the image sensor may enhance the sensitivity by decreasing the dark current density of the organic photodetector to improve the sensitivity as described above.

In FIG. 7, the organic photodetector 100 of FIG. 1 is included, but it is not limited thereto, and thus the organic photodetector 200 of FIG. 2 may be applied in the same manner.

The image sensor may be applied to various electronic devices, for example a mobile phone, a digital camera, etc., but is not limited thereto.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An organic photodetector comprising:
   an anode and a cathode facing each other; and
   an active layer between the anode and the cathode, the active layer including a p-type semiconductor and an n-type semiconductor,
   wherein a difference between a highest occupied molecular orbital (HOMO) energy level of the p-type semiconductor and a lowest unoccupied molecular orbital (LUMO) energy level of the n-type semiconductor is greater than or equal to about 0.8 eV, and
   wherein an energy barrier between the active layer and one of the anode and the cathode is greater than or equal to about 1.3 eV.

2. The organic photodetector of claim 1, wherein the energy barrier between the active layer and one of the anode and the cathode is one of an energy difference between a work function of the anode and a LUMO energy level of the p-type semiconductor and an energy difference between a work function of the cathode and a HOMO energy level of the n-type semiconductor.

3. The organic photodetector of claim 1, wherein a dark current density of the organic photodetector at a reverse bias of about −3 V is less than or equal to about $10^{-10}$ A/cm$^2$.

4. The organic photodetector of claim 1, wherein:
an energy barrier of the active layer and one of the anode and the cathode is about 1.5 eV; and
the difference between the HOMO energy level of the p-type semiconductor and the LUMO energy level of the n-type semiconductor is greater than or equal to about 1.0 eV.

5. The organic photodetector of claim 4, wherein a dark current density of the organic photodetector at a reverse bias of about −3 V is less than or equal to about $10^{-12}$ A/cm$^2$.

6. The organic photodetector of claim 1, wherein the active layer comprises:
a p-type layer closest to the anode, the p-type layer including a p-type semiconductor; and
an n-type layer closest to the cathode, the n-type layer including an n-type semiconductor.

7. The organic photodetector of claim 1, wherein a charge blocking layer is not between the anode and the active layer or between the cathode and the active layer.

8. The organic photodetector of claim 1, wherein at least one of the p-type semiconductor and the n-type semiconductor selectively absorbs a part of a visible ray wavelength region.

9. The organic photodetector of claim 8, wherein at least one of the p-type semiconductor and the n-type semiconductor selectively absorbs a green wavelength region.

10. The organic photodetector of claim 8, wherein:
the anode is indium tin oxide (ITO);
the LUMO energy level of the n-type semiconductor is −4.1 eV; and
the p-type semiconductor is a material having a LUMO energy level of about −2.6 to about −3.5 eV and a HOMO energy level of about −4.9 to about −5.8 eV.

11. The organic photodetector of claim 10, wherein an electron blocking layer is not between the anode and the active layer.

12. The organic photodetector of claim 8, wherein:
the anode is ITO;
the n-type semiconductor is $C_{60}$; and
the p-type semiconductor is a material having a HOMO energy level of about −5.3 to about −5.8 eV.

13. The organic photodetector of claim 12, wherein an electron blocking layer is not between the anode and the active layer.

14. The organic photodetector of claim 1, wherein the anode and the cathode are light-transmitting electrodes.

15. An image sensor comprising the organic photodetector of claim 1.

16. An electronic device comprising the image sensor of claim 15.

* * * * *